United States Patent
Kubota et al.

(10) Patent No.: US 11,731,234 B2
(45) Date of Patent: Aug. 22, 2023

(54) METHOD OF DOUBLE-SIDE POLISHING SEMICONDUCTOR WAFER

(71) Applicant: SUMCO CORPORATION, Tokyo (JP)

(72) Inventors: Mami Kubota, Tokyo (JP); Fumiya Fukuhara, Tokyo (JP); Tomonori Miura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1167 days.

(21) Appl. No.: 16/341,692

(22) PCT Filed: Oct. 3, 2017

(86) PCT No.: PCT/JP2017/036008
§ 371 (c)(1),
(2) Date: Apr. 12, 2019

(87) PCT Pub. No.: WO2018/083931
PCT Pub. Date: May 11, 2018

(65) Prior Publication Data
US 2020/0039021 A1 Feb. 6, 2020

(30) Foreign Application Priority Data

Nov. 2, 2016 (JP) .................. 2016-215561

(51) Int. Cl.
*B24B 37/08* (2012.01)
*B24B 37/28* (2012.01)
(Continued)

(52) U.S. Cl.
CPC ............ *B24B 37/20* (2013.01); *B24B 37/042* (2013.01); *B24B 37/28* (2013.01); *H01L 21/02016* (2013.01); *H01L 21/02024* (2013.01)

(58) Field of Classification Search
CPC ......... H01L 21/02024; H01L 21/02013; B24B 37/042
See application file for complete search history.

(56) References Cited

U.S. PATENT DOCUMENTS 9,403,257 B2   8/2016  Miura et al.
9,862,072 B2   1/2018  Asai
(Continued)

FOREIGN PATENT DOCUMENTS

JP   2004-306173 A   11/2004
JP   2012-232353 A   11/2012
(Continued)

OTHER PUBLICATIONS

International Premininary Report of Patentability issued in International Bureau of WIPO Patent Application No. PCT/JP2017/036008, dated May 7, 2019, together with an English translation.
(Continued)

*Primary Examiner* — Orlando E Aviles
*Assistant Examiner* — J Stephen Taylor
(74) *Attorney, Agent, or Firm* — Greenblum & Bernstein, P.L.C.

(57) ABSTRACT

Provided is a method of double-side polishing a semiconductor wafer, which can suppress variation in the polishing quality by providing for changes in the polishing environment during polishing. The method of double-side polishing of a semiconductor wafer includes: a step of predetermining a criterion function for determining polishing tendencies of double-side polishing; a first step of starting double-side polishing of the semiconductor wafer under initial polishing conditions; a second step of while performing double-side polishing on the semiconductor wafer under the initial polishing conditions, calculating a value of the criterion function using the apparatus log data in a predetermined period of polishing in the first step, and setting on the double-side polishing apparatus polishing conditions obtained by adjusting the initial polishing conditions based on the value of the criterion function; and a third step of performing double-side polishing of the semiconductor wafer under the adjusted polishing conditions.

4 Claims, 4 Drawing Sheets

(51) Int. Cl.
*H01L 21/02* (2006.01)
*B24B 37/20* (2012.01)
*B24B 37/04* (2012.01)

(56) References Cited

U.S. PATENT DOCUMENTS

| | | | |
|---|---|---|---|
| 2014/0256227 A1* | 9/2014 | Aoki | B24B 37/042 |
| | | | 451/8 |
| 2015/0065010 A1* | 3/2015 | Miura | B24B 37/013 |
| | | | 451/262 |
| 2015/0209931 A1* | 7/2015 | Asai | B24B 37/005 |
| | | | 451/6 |
| 2018/0138097 A1* | 5/2018 | Oba | B24B 49/12 |
| 2019/0160627 A1 | 5/2019 | Mikuriya et al. | |

FOREIGN PATENT DOCUMENTS

| | | |
|---|---|---|
| JP | 2014-099471 A | 5/2014 |
| JP | 2015-47656 A | 3/2015 |

OTHER PUBLICATIONS

U.S. Appl. No. 16/467,273 to Tsuyoshi Morita, filed Jun. 6, 2019.
Search Report issued in International Bureau of WIPO Patent Application No. PCT/JP2017/036008, dated Jan. 9, 2018, together with an English translation.

* cited by examiner

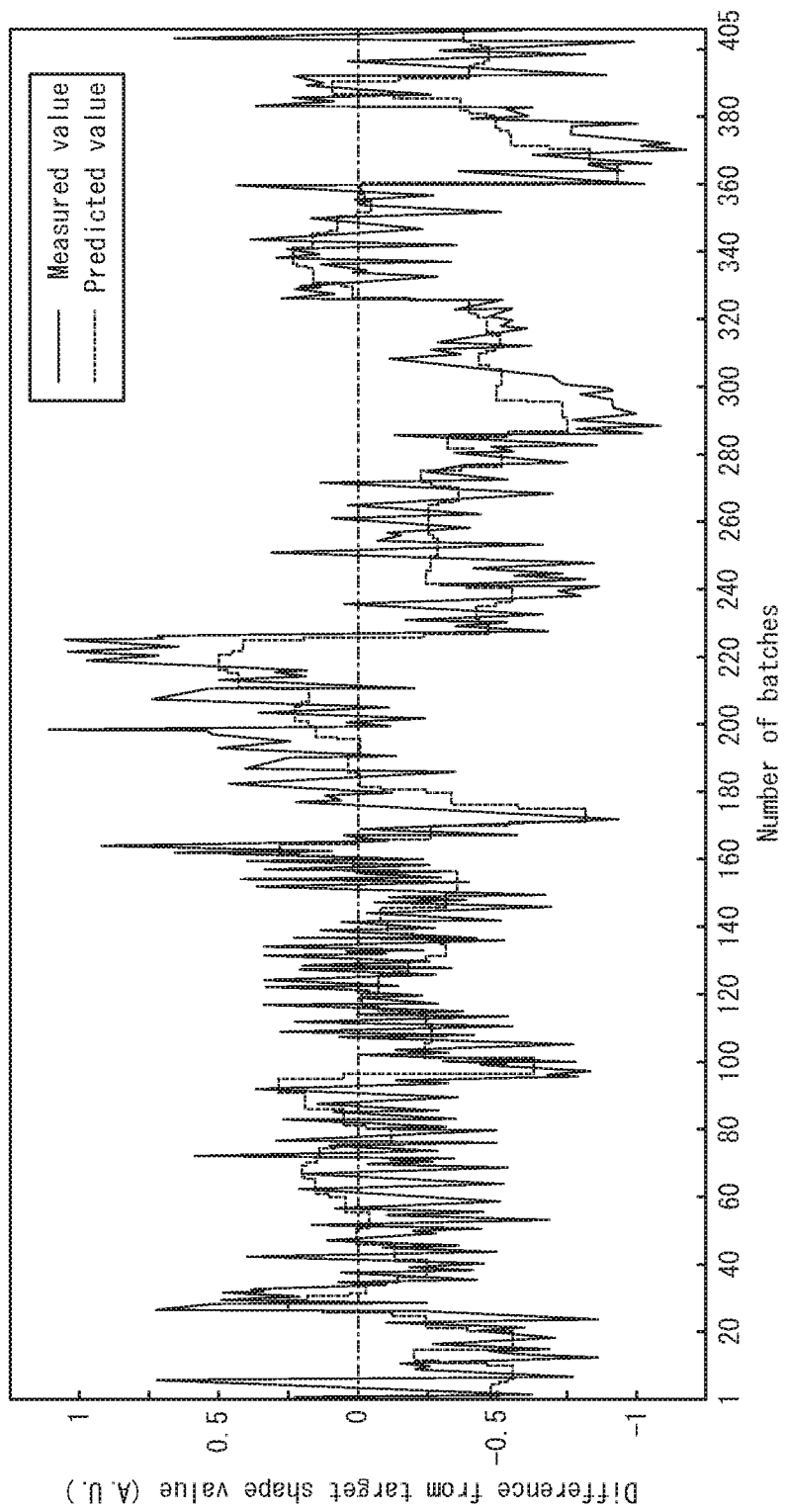

METHOD OF DOUBLE-SIDE POLISHING SEMICONDUCTOR WAFER

TECHNICAL FIELD

This disclosure relates to a method of double-side polishing a semiconductor wafer, by which both the front and back surfaces of a semiconductor wafer are simultaneously polished.

BACKGROUND

Silicon wafers and compound semiconductor wafers of GaAs etc. are known as semiconductor wafers. Semiconductor wafers are typically obtained by performing a slicing step of slicing a single crystal ingot into thin disk-shaped wafers using a wire saw, a grinding step of making the sliced wafer have flat front and back surfaces and a predetermined thickness, and a polishing step of performing mirror polishing for eliminating irregularities on the surfaces of the wafer having been subjected to grinding to achieve high flatness. Further, depending on use, an epitaxial layer may be formed using MOCVD etc. on a surface of a semiconductor wafer having been polished.

In the above polishing step for a semiconductor wafer, one or both of double-side polishing by which both surfaces of the semiconductor wafer are simultaneously polished and single-side polishing by which only one surface is polished is used, and multi-step polishing is also performed in which double-side polishing is performed and single-side polishing is then performed.

Here, a typical double-side polishing apparatus 9 according to conventional techniques will be described with reference to FIG. 1. As illustrated in FIG. 1, the double-side polishing apparatus 9 includes carrier plates 30 each having a retainer opening 40 for retaining a semiconductor wafer 20; an upper plate 50a and a lower plate 50b provided with polishing pads 60a and 60b, respectively; and a pair of motors 90a and 90b for rotating the upper plate 50a and the lower plate 50b, respectively.

The upper plate 50a and the lower plate 50b are configured so that the semiconductor wafers 20 retained in the retainer openings 40 can be sandwiched between the plates under desired load. The motors 90a and 90b rotate the upper plate 50a and the lower plate 50b in opposite directions. Each carrier plate 30 is provided with an external gear, and the external gear meshes with a sun gear 70 in the center part of the lower plate 50b and an internal gear 80 on the periphery of the lower plate 50b, thus the carrier plate 30 rotates and revolves (such motion is referred to as "planetary action"). Note that the sun gear 70 and the internal gear 80 are driven by respective motors 90c and 90d different from the motors 90a and 90b. The double-side polishing apparatus 9 makes the sandwiched carrier plates 30 perform planetary motion to simultaneously subject both front and back surfaces of the semiconductor wafers 20 to chemical mechanical polishing by applying pressure using the polishing pads 60a and 60b and applying slurry (not shown).

The shape requirements for a semiconductor wafer having been subjected to double-side polishing varies depending on the steps to be performed. For example, the center of a semiconductor wafer may have a convex shape or a concave shape. Therefore, in double-side polishing, the polishing conditions are required to be controlled to meet the requirements so that a semiconductor wafer having a desired shape is obtained.

A target shape to be obtained after polishing is determined before performing double-side polishing of a semiconductor wafer; however, it is difficult to achieve a completely precise shape that coincides with the target shape, and there must be an error. Further, in double-side polishing, when polishing proceeds, changes in the polishing environment such as wear on polishing pads, change in slurry temperature during polishing, and local change in the amount of slurry supplied are inevitable, and such changes in the polishing environment lead to further deterioration in the polishing quality. With a view to addressing the problems, various techniques to control polishing conditions for double-side polishing are contemplated.

For example, in a technique disclosed in JP 2014-099471 A (PTL 1), in a double-side polishing method for a semiconductor wafer, including first polishing at a high polishing rate and subsequent second polishing at a low polishing rate, in which the cross-sectional shape of sections of the semiconductor wafer is optically measured after polishing the semiconductor wafer, and polishing conditions of the first and second polishing in subsequent polishing are determined on a basis of the measurement results. According to PTL 1, this double-side polishing method can improve the flatness of the entire semiconductor wafer including its outermost circumference.

CITATION LIST

Patent Literature

PTL 1: JP 2014-099471 A

SUMMARY

Technical Problem

However, the double-side polishing method of PTL 1 is a technique in which polishing conditions modified after a polishing procedure are used in polishing of the next and subsequent batches. Accordingly, even if the technique described in PTL 1 can modify the polishing conditions for the next and subsequent polishing procedures, it cannot provide for changes in the polishing environment during a polishing procedure. As with the technique described in PTL 1, in conventional double-side polishing methods, although polishing conditions may be changed between a plurality of stages, specific polishing conditions for each stage are determined before starting polishing, and the polishing conditions are not adjusted once polishing is started. Therefore, double-side polishing methods using the conventional techniques have limitations to improving the yield since semiconductor wafers processed in a batch in which the polishing environment changes during polishing become defective products. Further, the polishing quality in terms of whether a polished semiconductor wafer has a target shape (that is, shape controllability) would vary in double-side polishing methods using the conventional techniques.

It could therefore be helpful to provide a method of double-side polishing a semiconductor wafer, which can suppress variation in the polishing quality by providing for changes in the polishing environment during polishing.

Solution to Problem

With a view to achieving the above objective, the inventors made intensive studies. The inventors then contemplated adjusting polishing conditions in-situ during polishing in order to provide for changes in the polishing environment. Adjusting polishing conditions in-situ can provide for changes in the polishing environment during polishing, resulting in reduced variation in the polishing quality.

The inventors made intensive studies, in which when multiple regression analysis was performed using a shape index of a semiconductor wafer as an objective variable and using apparatus log data as explanatory variables, they found a strong multiple correlation between those variables. Further, when the log data of the apparatus during polishing were fit to the linear function obtained by the multiple regression analysis, the state of the shape of the semiconductor wafer during polishing was found to be determined based on the value calculated from the linear function. Thus, the inventors found that variation in the polishing quality could be suppressed by adjusting the polishing conditions during polishing based on the determination result to provide for changes in the environment during polishing. This discovery led to this disclosure.

This disclosure completed based on the above findings primarily includes the following features.

(1) A method of double-side polishing of a semiconductor wafer using a double-side polishing apparatus, comprising:

a step of predetermining a criterion function for determining polishing tendencies of double-side polishing by performing multiple regression analysis based on a shape index of a plurality of semiconductor wafers having subjected to double-side polishing using the double-side polishing apparatus and on apparatus log data of the double-side polishing apparatus in a last stage of polishing corresponding to the shape index;

a first step of starting double-side polishing of the semiconductor wafer under initial polishing conditions;

subsequent to the first step, a second step of while performing double-side polishing on the semiconductor wafer under the initial polishing conditions, calculating a value of the criterion function using the apparatus log data in the last stage of polishing in the first step, and setting on the double-side polishing apparatus polishing conditions obtained by adjusting the initial polishing conditions based on the value of the criterion function; and subsequent to the second step, a third step of performing double-side polishing of the semiconductor wafer under the adjusted polishing conditions.

Note that the term "polishing conditions" herein refers to parameters having effects on chemical mechanical polishing over time, such as rotation speed, loads, slurry flow rate, and slurry temperature, and is distinguished from "polishing time".

(2) The method of double-side polishing a semiconductor wafer, according to (1) above, wherein polishing time in the third step is based on the value of the criterion function.

(3) The method of double-side polishing a semiconductor wafer, according to (1) or (2) above, wherein the adjusted polishing conditions involve adjustment of one or both of a rotation speed of plates of the double-side polishing apparatus and a load on the plates.

(4) The method of double-side polishing a semiconductor wafer, according to any one of (1) to (3) above, wherein the second step is started when a thickness of the semiconductor wafer reaches a predetermined thickness.

Advantageous Effect

This disclosure provides a method of double-side polishing a semiconductor wafer, which can suppress variation in the polishing quality by providing for changes in the polishing environment during polishing.

BRIEF DESCRIPTION OF THE DRAWINGS

In the accompanying drawings:

FIG. 4 is a graph depicting measured values and predicted values of the difference between measured shape values and a target value in determining the criterion function in the Example.

DETAILED DESCRIPTION

Figure 1:
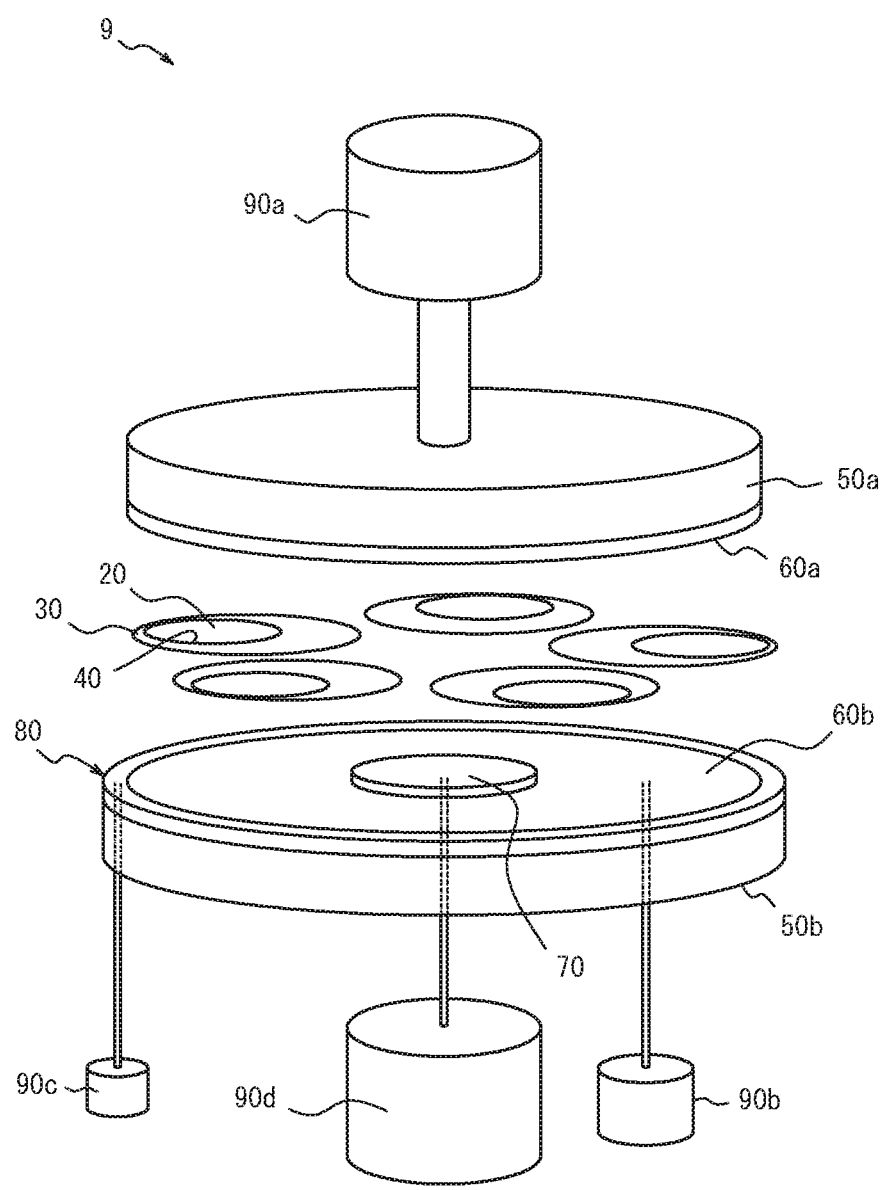
FIG. 1 is a schematic view illustrating a double-side polishing apparatus for a semiconductor wafer in accordance with conventional techniques.

A method of double-side polishing a semiconductor wafer according to one embodiment of this disclosure will now be described with reference to the drawings. Note that the components in the drawings are vertically exaggerated for convenience of description, and the vertical and horizontal scales are different.

Figure 2:
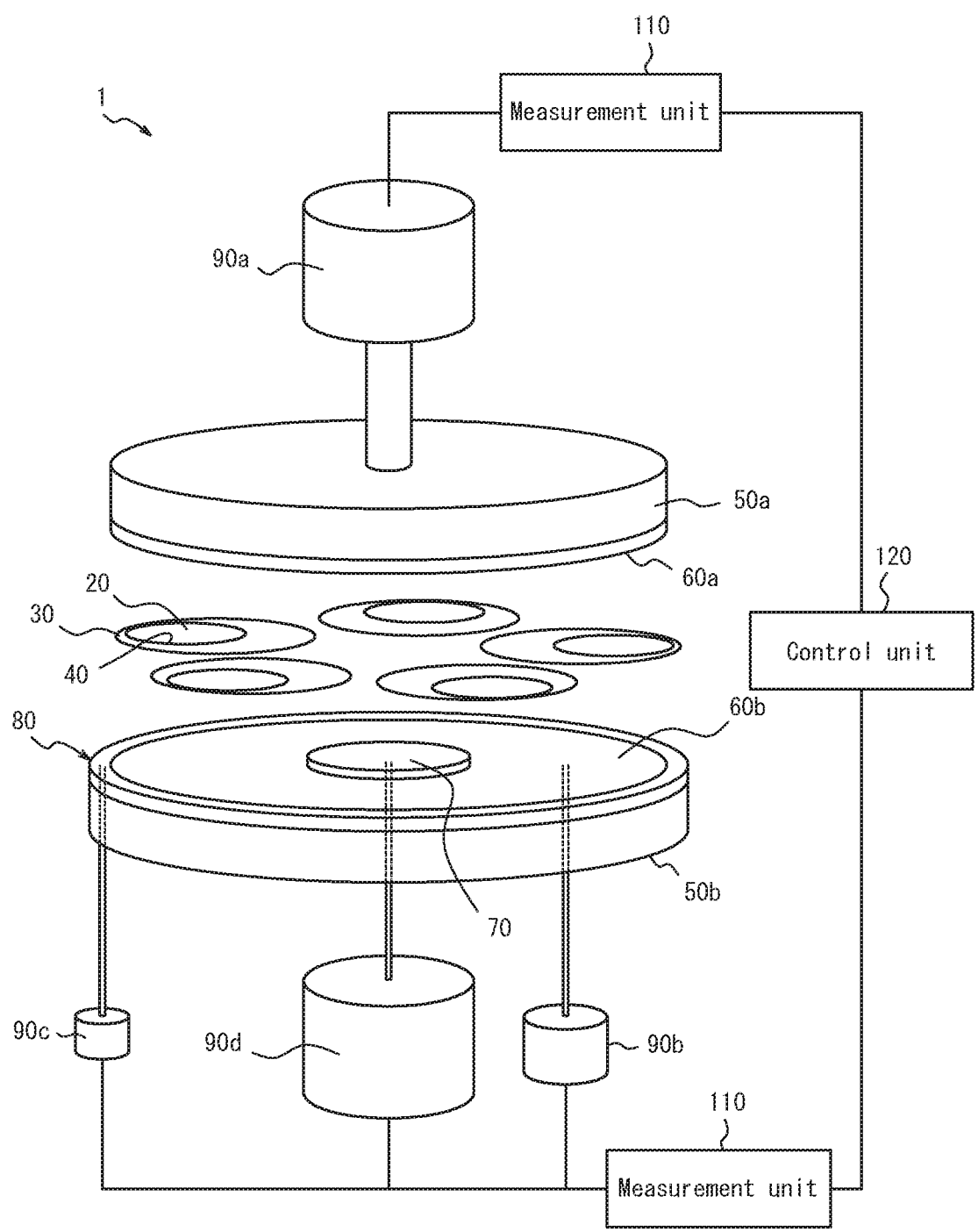
FIG. 2 is a schematic view of a double-side polishing apparatus for a semiconductor wafer, which apparatus is used for a method of double-side polishing a semiconductor wafer in accordance with one embodiment of this disclosure.

In a method of double-side polishing a semiconductor wafer according to one embodiment of this disclosure, double-side polishing is performed on a semiconductor wafer using a double-side polishing apparatus, for example, the double-side polishing apparatus 1 illustrated in FIG. 2. The double-side polishing includes the steps given in the flow chart of FIG. 3.

First, the double-side polishing apparatus 1 which can be used in this embodiment is described with reference to FIG. 2. Features of the double-side polishing apparatus 1 that are similar to the double-side polishing apparatus 9 described above with reference to FIG. 1 are denoted by the same reference numerals, and the description of the features may not be repeated. The double-side polishing apparatus 1 includes carrier plates 30 each having a retainer opening 40 for retaining a semiconductor wafer 20; an upper plate 50*a* and a lower plate 50*b* provided with polishing pads 60*a* and 60*b*, respectively; and a pair of motors 90*a* and 90*b* for rotating the upper plate 50*a* and the lower plate 50*b*, respectively.

The upper plate 50*a* and the lower plate 50*b* are configured so that the semiconductor wafers 20 retained in the retainer openings 40 can be sandwiched between the plates under desired load. The motors 90*a* and 90*b* rotate the upper plate 50*a* and the lower plate 50*b* in opposite directions. Each carrier plate 30 is provided with an external gear, and the external gear meshes with a sun gear 70 in the center part of the lower plate 50*b* and an internal gear 80 on the periphery of the lower plate 50*b*, thus the carrier plates operate with planetary action. Note that the sun gear 70 and the internal gear 80 are driven by motors 90*c* and 90*d*, respectively, which motors are different from the motors 90*a* and 90*b*. The double-side polishing apparatus 1 makes the sandwiched carrier plates 30 perform planetary motion to simultaneously subject both front and back surfaces of the semiconductor wafers 20 to chemical mechanical polishing by applying pressure using the polishing pads 60*a* and 60*b* and applying slurry (not shown).

Although not shown in FIG. 2 for brevity of the schematic view of the double-side polishing apparatus 1, the double-side polishing apparatus may also include typical known features used in double-side polishing apparatuses, such as an inlet and an outlet for the supply of slurry; an inlet and an outlet for steady constant-temperature water and a constant-temperature chamber in each plate that serve to maintain the temperature of the plates constant; and a wavelength-variable infrared laser meter for measuring the thickness of a semiconductor wafer during polishing. Further, each carrier plate 30 is rotated when the external gear of the carrier plate 30 meshes with the sun gear 70 and the internal gear 80. Note that the mesh of the external gear of the carrier plate with the sun gear 70 and the internal gear 80 is not shown for brevity of the schematic view of the double-side polishing apparatus 1. Moreover, the internal gear 80 may be composed of a high number of pivot pins or gears arranged in the circumference direction, in which case the carrier plates 30 can be rotated when the individual pivot pins or gears mesh with the external gear of the carrier plates 30. Note that the pivot pins are not shown for brevity of the schematic view of the double-side polishing apparatus 1.

Further, the double-side polishing apparatus 1 is provided with a measurement unit 110, which can acquire apparatus log data of the double-side polishing apparatus 1 in real time as the polishing proceeds during double-side polishing. The apparatus log data may include various kinds of apparatus data that can be measured with respect to the double-side polishing apparatus 1, such as the thickness of the semiconductor wafer during polishing, rattling of the upper and lower plates, flow rate of slurry, the temperature of incoming slurry, the temperature of outgoing slurry, the rotation speed of the upper plate, the rotation speed of the lower plate, the temperature of incoming constant-temperature water, the temperature of outgoing constant-temperature water, the load factor of the upper plate, the load factor of the lower plate, the load factor of the sun gear, and the rotation speed of the carrier plates. A control unit 120 of the double-side polishing apparatus 1 controls the above-described features to perform double-side polishing, whereas the measurement unit 110 acquires apparatus log data of the double-side polishing apparatus 1 in real time.

The double-side polishing method of this embodiment includes at least steps S0 to S30 described below using the double-side polishing apparatus described above, thereby performing double-side polishing on a semiconductor wafer. Specifically, a step S0 is performed first, in which a criterion function for determining polishing tendencies of double-side polishing is predetermined by performing multiple regression analysis based on a shape index of a plurality of semiconductor wafers having subjected to double-side polishing using the double-side polishing apparatus and on apparatus log data of the double-side polishing apparatus corresponding to the shape index. A first step S10 is then performed, in which double-side polishing of the semiconductor wafer is started under initial polishing conditions. Subsequent to the first step S10, a second step S20 is performed in which while double-side polishing is performed on the semiconductor wafer under the initial polishing conditions, a value of the criterion function is calculated using the apparatus log data in a last stage of polishing in the first step S10, and polishing conditions obtained by adjusting the initial polishing conditions are set on the double-side polishing apparatus based on the value of the criterion function. Further, subsequent to the second step S20, a third step S30 is performed in which double-side polishing of the semiconductor wafer is performed under the adjusted polishing conditions. Note that in this embodiment, the first step S10 to the third step S30 are performed continuously without stopping polishing. These steps will be sequentially described in detail below.

<Step of Predetermining Criterion Function>

The step S0 of predetermining a criterion function in this embodiment is described in detail. Note that this step S0 is performed prior to double-side polishing of a semiconductor wafer.

A criterion function determined in this step S0 can be determined as follows. First, a shape index of a plurality of semiconductor wafers having been subjected to double-side polishing using a double-side polishing apparatus, and apparatus log data of the double-side polishing apparatus corresponding to the shape index are measured in advance. The number of measurements is a number sufficient to provide statistical significance. As the shape index of a semiconductor wafer, GBIR (global backside ideal range) can be used, which is a typical global flatness index for evaluating the thickness variation in the entire surface of the semiconductor wafer. Note that GBIR is a positive value since it is defined with an absolute value; therefore, GBIR cannot express irregularities on a semiconductor wafer. Even if similar values are measured, radically different results may be obtained by visual evaluation; for example, when the thickness of the center of a semiconductor wafer is larger than the average thickness of the semiconductor wafer, the semiconductor wafer is determined to have a convex center shape by visual observation and is determined to have a concave center shape by visual observation in the opposite case. When the thickness of the center of a semiconductor wafer is larger than the average thickness of the semiconductor wafer, the value of GBIR is expressed with a plus sign, whereas when the thickness of the center of a semiconductor wafer is smaller than the average thickness of the semiconductor wafer, the value of GBIR is expressed with a minus sign. GBIR expressed with a plus or minus sign according to the above definition is hereinafter referred to as "GBIR (plus/minus)".

GBIR (plus/minus) itself may be used as a shape index, or a value relative to GBIR (plus/minus) of a target shape (for example, difference between a measured GBIR (plus/minus) and GBIR (plus/minus) of the target shape) may be used.

Note that GBIR can be determined by calculating the difference between the maximum displacement and the minimum displacement of the entire wafer from the back surface of the wafer as a reference on the condition that the back surface of the semiconductor having been polished is entirely held by suction, and a commercially available laser displacement meter can be used for the measurement. GBIR (plus/minus) corresponds to the relation between the thickness of the center of the wafer described above and the average thickness. Although GBIR (plus/minus) is used as a shape index of a semiconductor wafer in the above description, the shape index is not limited to indices relating to global flatness, and an index according to another definition may be used instead as long as it is an index relating to flatness (for example SFQR, ESFQR, etc.).

Here, multiple regression analysis is performed using the shape index described above as an objective variable Y, and using a plurality of kinds of apparatus data types in the apparatus log data of the double-side polishing apparatus in a last stage of polishing, which are acquired when the shape index is obtained, as explanatory variables X ($X_1, X_2, \ldots, X_N$ where N is a positive integer). Note that as the apparatus log data, the average values in a predetermined period in a last stage of polishing including the end of double-side polishing is preferably used, for example, the average values in a period of 30 s to 120 s prior to and including the end of double-side polishing is preferably used. A criterion function represented by the following formula (1) can be obtained by multiple regression analysis.

$$Y = A_0 + A_1 X_1 + A_2 X_2 + \ldots A_N X_N \quad (1)$$

Here, $A_0$ is a constant, and $A_1, A_2, \ldots, A_N$ (where N is a positive integer) are partial regression coefficients.

Further, $A_0, A_1, A_2, \ldots, A_N$ can be determined by a typical statistical technique such as the least square method.

As also described in the Example below, a study made by the inventors confirmed that there is a strong multiple correlation between predicted values of the shape index obtained by the above formula (1) and measured values of the shape index. Thus, the inventors found that when apparatus log data during polishing are plugged into the above formula (1), the shape index of a semiconductor wafer at that point of time during can be evaluated accurately, and polishing tendencies of double-side polishing (the progress of polishing found by comparing a convex center shape or a concave center shape with the target shape) can be determined. In this embodiment, while polishing on a semiconductor wafer is continued, the shape of the semiconductor wafer is evaluated using the criterion function of the above formula (1), and polishing conditions are adjusted based on the value of the criterion function, thereby performing polishing under the adjusted polishing conditions.

<First Step>

In the first step S10, given initial polishing conditions are set on the double-side polishing apparatus, and double-side polishing on the semiconductor wafer is then started. The polishing time of polishing performed in the first step S10 may be set as desired. Accordingly, the first step S10 may proceed to the second step S20 after a lapse of the polishing time. Further, in order to increase the accuracy of removal of the material by polishing, it is preferred that the first step S10 proceeds to the second step S20 when the thickness of the semiconductor wafer reaches a predetermined thickness; in other words, the second step S20 is started when the thickness of the semiconductor wafer reaches a predetermined thickness.

<Second Step>

In the second step S20, subsequent to the first step S10, double-side polishing is performed on the semiconductor wafer under the same initial polishing conditions as the first step S10. In the second step S20, while this double-side polishing is performed, the value of the criterion function according to the above formula (1) is calculated using the apparatus log data in the last stage of polishing in the first step S10 (step S21). Further, based on the value of the criterion function, adjusted polishing conditions obtained by adjusting the above initial polishing conditions are set on the double-side polishing apparatus (step S22). Detailed aspects of the steps S21 and S22 will be described in order.

In the step S21, the apparatus log data of the last stage of polishing in the first step S10 are read, and the value of the criterion function is calculated by substituting the apparatus log data in the above formula (1). Based on the calculated value of the criterion function (more specifically, based on whether the value is larger or smaller than the value of the criterion function of the case where the target shape can be achieved and on the difference between the values), the degree of approximation of the shape of the semiconductor wafer in the last stage of polishing in the first step and the target shape (that is, polishing tendencies including the deviation from the target shape to be obtained by polishing) can be evaluated accurately.

Here, in the step S22, based on the value of the criterion function, adjusted polishing conditions obtained by adjusting the initial polishing conditions are set on the double-side polishing apparatus. The adjustment of polishing conditions performed in the step S22 will be described in more detail considering the case where the target shape has a convex center shape (in this case, GBIR (plus/minus) is expressed with a plus sign).

When the value of the criterion function calculated in the step S21 is larger than the value of GBIR (plus/minus) of the target shape, the semiconductor wafer in the last stage of polishing in the first step S10 is determined to have a more convex center shape than the target shape. In this case, polishing conditions are adjusted so that polishing is further concentrated on the center of the semiconductor wafer. Accordingly, when the semiconductor wafer in the last stage of polishing in the first step S10 has a more convex center shape than the target shape, the initial polishing conditions are determined to be polishing conditions resulting in excessive convexity in accordance with changes in the polishing environment; hence, adjustment is performed to reduce the convexity in the center.

By contrast, when the value of the criterion function calculated in the step S21 is smaller than the value of GBIR (plus/minus) of the target shape, the semiconductor wafer in the last stage of polishing in the first step S10 is determined to have a more concave center shape than the target shape. Accordingly, when the semiconductor wafer in the last stage of polishing in the first step S10 has more concave center shape than the target shape, the initial polishing conditions are determined to be polishing conditions resulting in inadequate convexity in accordance with changes in the polishing environment. In this case, adjustment may be performed to modify polishing conditions thereby intensively polishing a periphery of the semiconductor wafer (in other words, center convexity may be increased).

For example, when the rotation speed of the plates is increased or a load on the plates is increased, the polishing conditions are known to result in intensive polishing on the periphery of a semiconductor wafer (the wafer center approximates a convex shape). Similarly, when the rotation speed of the plates is reduced or a load on the plates is reduced, the polishing conditions are known to result in intensive polishing on the center of a semiconductor wafer (the wafer center approximates a concave shape). As described above, the periphery or the center of a semiconductor wafer can be selectively and intensively polished by changing the polishing conditions; thus, the shape of the semiconductor wafer in the last stage of polishing in the first step S10 can be made closer to the target shape by performing polishing using the adjusted polishing conditions.

A portion (part) of a wafer in the radial direction, to be intensively polished, such as the wafer center area, or the wafer periphery area, can be controlled particularly easily by adjusting the rotation speed of the plates and a load on the plates of the polishing conditions of the double-side polishing apparatus. Accordingly, the adjusted polishing conditions preferably involve adjustment of at least one or both of the rotation speed of the plates and a load on the plates of the double-side polishing apparatus; more preferably, the adjustment is performed by increasing or reducing both the rotation speed of the plates and a load on the plates of the double-side polishing apparatus.

Note that the polishing time in the second step S20 is the sum of the calculation time during which the value of the criterion function described above and the time during which the adjusted polishing conditions obtained by adjustment based on the value is set on the double-side polishing apparatus, so that the polishing time is several seconds to several tens of seconds at longest although depending on the specifications of the double-side polishing apparatus. It should be noted that, in this embodiment, since polishing conditions are adjusted in-situ, polishing is continued during the second step S20.

<Third Step>

In the third step S30, double-side polishing is performed subsequent to the second step S20. In the first step S10 and the second step S20, polishing is performed under the initial polishing conditions; on the other hand, in this third step S30, double-side polishing of the semiconductor wafer is performed under the adjusted polishing conditions set in the second step S20. Further, since double-side polishing is performed under the above-described adjusted polishing conditions in this third step S30, the shape of the semiconductor wafer after polishing in the third step S30 can be made even closer to the target shape than the shape of the semiconductor wafer in the last stage of polishing in the first step.

The polishing time in the third step S30 may be any given time, and the polishing time may be set as desired. However, the polishing time in the third step S30 is preferably based on the value of the criterion function described above, and the polishing time is more preferably set using the following formula (2). This is because polishing can be performed taking into account the difference from the target shape in the last stage of the first step S10.

$$[\text{Polishing time of third step}] = B \times |Y_1 - Y_0| + C \quad (2)$$

Here, B and C are constants depending on the target shape, and C may be 0. Further, $Y_1$ is a value of the criterion function determined in the second step S20, $Y_0$ is a value of the shape index of the target shape, and $|Y_1 - Y_0|$ means the absolute value of $Y_1 - Y_0$.

Thus, in this embodiment, the above-described criterion function is predetermined, and double-side polishing of the semiconductor wafer is then performed in accordance with the first step S10 to the third step S30, thus changes in the polishing environment during polishing can be provided for and the polishing quality can be improved. Further, when the double-side polishing method according to this embodiment is applied to mass production, variation in the polishing quality of the resultant semiconductor wafers can be suppressed. It should readily be understood that once the criterion function described above is determined, the criterion function need not be determined again when polishing according to this embodiment is performed in a mass production stage.

Note that in order to further increase the reliability the criterion function, apparatus log data to be used in the second step S20 in this embodiment are preferably made to agree with the apparatus log data used in the step S0 of predetermining the criterion function, in advance. Specifically, in the step S0 of predetermining the criterion function, when the average values of the apparatus log data in a predetermined period towards the end of double-side polishing (for example, the average in 30 s to 120 s) are used as the apparatus log data, average values in the same time period as the foregoing predetermined period towards the end of the first step S10 are preferably used also in the second step S20.

The above embodiment is described assuming that polishing is performed in the third step S30; however, if the value of the criterion function calculated in the second step S20 agrees with the value of the shape index of the target shape, polishing need not be performed in the third step S30. In other words, the adjusted polishing conditions may involve a case where polishing is stopped. In this case, polishing conditions are adjusted to stop the rotation of the plates or stop applying loads to the plates instead of adjusting the polishing time in the third step S30.

Further, the total polishing time through the first step S10 to the third step S30 may be a typical polishing time for double-side polishing, and may be for example around 20 min to 1 h. The polishing time in the first step S10 is preferably 50% or more of the total polishing time, more preferably 80% or more thereof. This is because the polishing in the third step S30 is aimed at compensating for polishing by the first step S10.

Further, the double-side polishing according to this embodiment includes at least the steps S0 to S30 described above. After the third step S30, polishing may be performed by calculating a value of the criterion function in the same manner as in the second step S20 and the third step S30 in this embodiment, and setting on double-side polishing apparatus readjusted polishing conditions obtained by readjusting the polishing conditions of the third step based on this value of the criterion function.

Moreover, after performing the steps of the double-side polishing method according to this embodiment, the polishing may be stopped, followed by optional finish polishing, in which for example a different kind of slurry or slurry containing no abrasive grains is applied.

Specific aspects applicable to this embodiment will be described below; however, this embodiment is not limited to the aspects described below.

The carrier plates 30 can be made of any given material, for example, steel special use stainless (SUS); a resin material such as epoxy, phenol, or polyimide; or fiber reinforced plastic obtained by combining a resin material with reinforcing fiber such as glass fiber, carbon fiber, or aramid fiber. When the carrier plates used are made of a material that wears out fast, such as a resin material, the polishing method according to this embodiment can suitably be used since the polishing environment changes greatly.

The polishing pads 60a and 60b and slurry can be of any type. For example, for the polishing pads, a pad of non-woven cloth made of polyester or a pad made of polyurethane can be used. As the slurry to be applied, for example, an alkaline aqueous solution containing free abrasive grains can be used.

A semiconductor wafer to which this disclosure is applied is preferably a silicon wafer; alternatively, this disclosure can be applied to double-side polishing of any given semiconductor wafer subjected to double-side polishing, for example, a SiC wafer, a sapphire wafer, and a compound semiconductor wafer.

EXAMPLE

Next, in order to clarify the effects of this disclosure, an example is given below; however, this disclosure is not limited to the following example in any way.

<Criterion Function>

Figure 3:
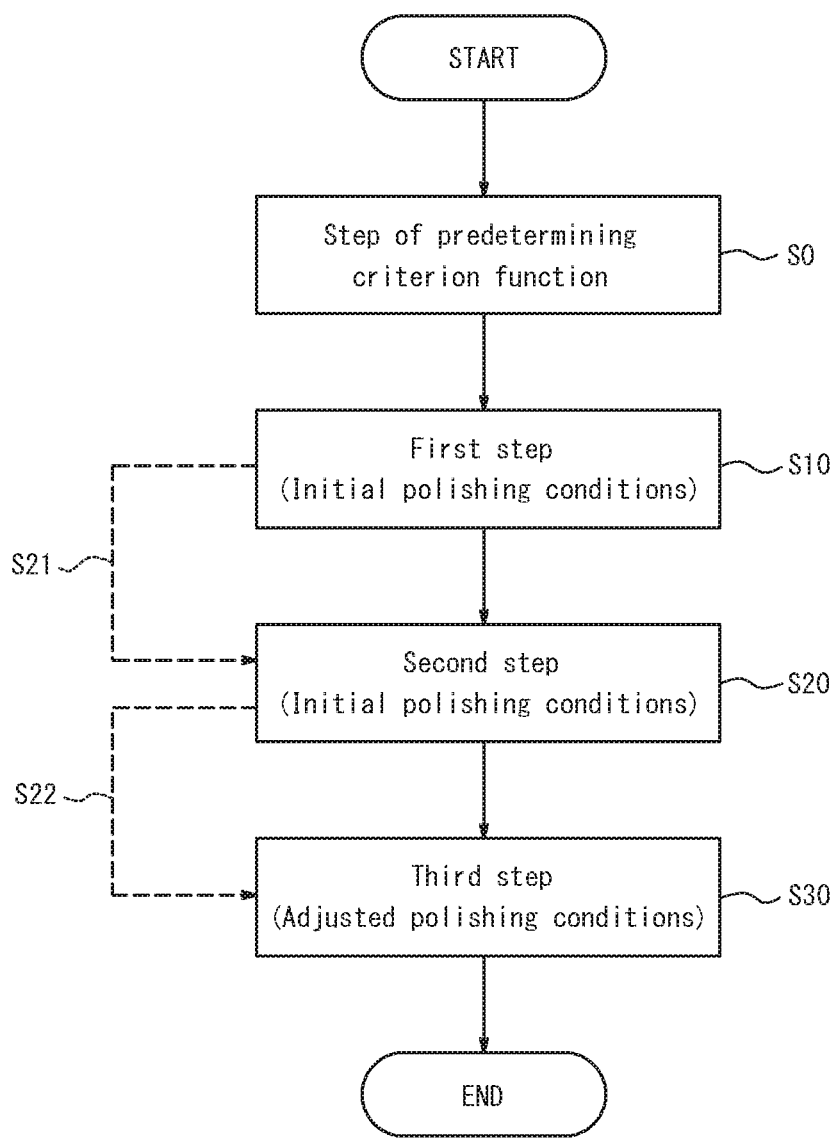
FIG. 3 is a flow chart illustrating a method of double-side polishing a semiconductor wafer according to one embodiment of this disclosure.

First, a criterion function was determined in accordance with the step S0 in the flow chart of FIG. 3. A double-side polishing apparatus having the same structure as one in FIG. 2 described above was used. As a semiconductor wafer, a p++ silicon wafer having an initial thickness of 790 μm and a diameter of 300 mm was used. Further, carrier plates used in this Example was made of SUS, and all the carrier plates used were identical. In the double-side polishing apparatus, a single silicon wafer was placed on each single carrier plate, and five carrier plates were provided per batch. Double-side polishing was performed until the thickness of the silicon wafers reached 777 μm. During the double-side polishing, apparatus log data of the double-side polishing apparatus were kept being acquired. While the carrier plates were held between an upper plate and a lower plate with a constant load (pressure) being applied to the plates using an elevating device, the upper plate and the lower plate were rotated in mutually opposite directions. The carrier plates were rotated in the same direction as the upper plate by the engagement between an internal gear, a sun gear, and external gears of the carrier plates to polish both front and back surfaces of the five silicon wafers loaded on the respective carrier plates. Note that the upper plate, lower plate, internal gear, and sun gear were rotated by different motors. The apparatus log data included the following apparatus data.

($x_1$) Slurry flow rate [L/min]
($x_2$) Incoming slurry temperature [° C.]
($x_3$) Temperature of incoming constant-temperature water [° C.]
($x_4$) Load factor of upper plate (Load current value) (%)
($x_5$) Load factor of lower plate (Load current value) (%)
($x_6$) Load factor of sun gear (Load current value) (%)

The load current value of $x_4$ to $x_6$ is the ratio of actual current value [A] of the upper plate, lower plate, and sun gear with respect to the maximum motor specification capacity [A] thereof, expressed in percentage. When the actual current value is equal to the maximum motor specification capacity, the load current value is 100%.

GBIR (plus/minus) of a target shape to be obtained after polishing is hereinafter simply referred to as "target shape value". GBIR (plus/minus) of each silicon wafer having been polished was measured using a flatness measurement system (WaferSight manufactured by KLA-Tencor). The difference calculated by subtracting the target shape value to be obtained after polishing from the GBIR (plus/minus) value measured after polishing is given in FIG. 4. Note that the difference from the target shape value is expressed using relative values in the graph of FIG. 4. Note that since the target shape to be obtained after polishing had a convex center in this Example, when the difference from the target shape value was a positive value, the wafer had a more convex center shape than the target shape, whereas when the difference from the target shape value was a negative value, the wafer had a more concave center shape than the target shape.

Next, multiple regression analysis was performed using the difference from the target shape value as an objective variable Y, and $x_1$ to $x_6$ listed above as explanatory variables, thus the following formula (3) was obtained. Note that $x_1$ to $x_6$ listed above are average values in 60 s prior to and including the end of the polishing.

$$Y = -0.00363x_1 + 0.003336x_2 - 0.017465x_3 + 0.000159x_4 + 0.000323x_5 + 0.000036x_6 + 3.912357 \quad (3)$$

Predicted values of the difference from the target shape values obtained by the above formula (3) are also given in FIG. 4. The multiple correlation coefficient between the measured values and the predicted values was 0.85. This is considered a sufficiently strong multiple correlation.

<Double-Side Polishing>

Double-side polishing was performed on the silicon wafers using the above formula (3) in accordance with the steps S10 to S30 in the flow chart of FIG. 3. The silicon wafers and initial polishing conditions were the same as those in the case of determining the criterion function. A polishing time in the first step was set to 1500 s, and calculation of the second step was started when 1500 s had passed since the polishing was started. Further, a value a of the criterion function was calculated using the above formula (3). As the apparatus log data used in the second step, the average values in the last 60 s of the first step (that is, from 1460 s to 1500 s from the start) were used.

In the second step S20, when the value a of the criterion function was positive, the rotation speed of the upper plate was increased by 1.35 rpm from the initial polishing conditions and the load on the plates was increased by 10% therefrom, thus the polishing conditions were adjusted. On the other hand, when the value a of the criterion function was negative, the rotation speed of the upper plate was reduced by 1.35 rpm from the initial polishing conditions and the load on the plates was reduced by 10% therefrom, thus the polishing conditions were adjusted. Note that no case was found where the value a of the criterion function was zero. Further, the polishing time in the third step S30 was defined by the following formula (4).

$$[\text{Polishing time of third step}] = 12.57 \times \alpha \quad (4)$$

Double-side polishing in accordance with the above conditions was performed on total 115 silicon wafers in 23 batches, and GBIR (plus/minus) of all the wafers was measured to obtain measurement results of the Example of this disclosure.

The wafers having been polished, of which GBIR (plus/minus) was within a range of ±10 nm from GBIR (plus/minus) of the target shape value were evaluated as conforming products, and the yield was determined.

When GBIR (plus/minus) of the wafers measured when the criterion function was determined is regarded as a measurement result of a conventional technique, the product yield achieved by the conventional technique was found to be 78.5%, whereas the product yield was found to have been improved to 93.8% in the Example of this disclosure.

The above results suggest that the product yield was substantially improved because changes in the polishing environment during polishing were provided for by the disclosed double-side polishing method. Further, variation in the polishing quality was found to have been suppressed since the changes in the polishing environment during polishing were provided for.

INDUSTRIAL APPLICABILITY

A method of double-side polishing a semiconductor wafer according to this disclosure can suppress variation in the polishing quality by providing for changes in the polishing environment during polishing.

REFERENCE SIGNS LIST 1, 9: Polishing apparatus
20: Semiconductor wafer
30: Carrier plate
40: Retainer opening
50a: Upper plate
50b: Lower plate
60a: Polishing pad 60b: Polishing pad
70: Sun gear
80: Internal gear
90a: Motor
90b: Motor
90c: Motor
90d: Motor
110: Measurement unit
120: Control unit

The invention claimed is:

1. A method of double-side polishing of a semiconductor wafer using a double-side polishing apparatus, comprising:
    a step of predetermining a criterion function for determining polishing tendencies of double-side polishing by performing multiple regression analysis based on a shape index of a plurality of semiconductor wafers having been subjected to double-side polishing using the double-side polishing apparatus and on apparatus log data of the double-side polishing apparatus in a last stage of polishing corresponding to the shape index;
    a first step of starting double-side polishing of the semiconductor wafer under initial polishing conditions;
    subsequent to the first step, a second step of while performing double-side polishing on the semiconductor wafer under the initial polishing conditions, calculating a value of the criterion function using apparatus log data obtained from a last stage of polishing in the first step, and setting on the double-side polishing apparatus polishing conditions obtained by adjusting the initial polishing conditions based on the value of the criterion function; and
    subsequent to the second step, a third step of performing double-side polishing of the semiconductor wafer under the adjusted polishing conditions.

2. The method of double-side polishing a semiconductor wafer, according to claim 1, wherein a polishing time in the third step is based on the value of the criterion function.

3. The method of double-side polishing a semiconductor wafer, according to claim 1, wherein the adjusted polishing conditions involve adjustment of one or both of a rotation speed of plates of the double-side polishing apparatus and a load on the plates.

4. The method of double-side polishing a semiconductor wafer, according to claim 1, wherein the second step is started after the first step is completed.

* * * * *